US008661308B2

(12) United States Patent
Li (10) Patent No.: US 8,661,308 B2
(45) Date of Patent: Feb. 25, 2014

(54) METHOD AND DEVICE FOR FAST CYCLIC REDUNDANCY CHECK CODING

(75) Inventor: Shuangxi Li, Guangdong Province (CN)

(73) Assignee: ZTE Corporation, Shenzhen, Guangdong Province (CN)

(*) Notice: Subject to any disclaimer, the term of this patent is extended or adjusted under 35 U.S.C. 154(b) by 138 days.

(21) Appl. No.: 13/258,620

(22) PCT Filed: Apr. 23, 2010

(86) PCT No.: PCT/CN2010/072165
§ 371 (c)(1),
(2), (4) Date: Oct. 19, 2011

(87) PCT Pub. No.: WO2010/135942
PCT Pub. Date: Dec. 2, 2010

(65) Prior Publication Data
US 2012/0102382 A1 Apr. 26, 2012

(30) Foreign Application Priority Data
May 25, 2009 (CN) .......................... 2009 1 0085524

(51) Int. Cl.
*H03M 13/00* (2006.01)
(52) U.S. Cl.
USPC ........................... 714/749; 714/807; 714/752
(58) Field of Classification Search
USPC ......... 714/807, 749, 750, 756, 748, 752, 782, 714/758
See application file for complete search history.

(56) References Cited

U.S. PATENT DOCUMENTS

| 3,703,705 A | 11/1972 | Patel |
| 7,363,574 B1 | 4/2008 | Maitland et al. |
| 7,461,325 B2 * | 12/2008 | Eroz et al. ..................... 714/758 |
| 7,716,556 B2 * | 5/2010 | Chen ............................. 714/769 |
| 7,856,586 B2 * | 12/2010 | Eroz et al. ..................... 714/758 |
| 7,916,775 B2 * | 3/2011 | Kim et al. ...................... 375/220 |
| 8,028,217 B2 * | 9/2011 | Pietraski et al. .............. 714/758 |
| 2003/0120992 A1 | 6/2003 | Glaise et al. |
| 2005/0005224 A1 | 1/2005 | Ridgeway et al. |

FOREIGN PATENT DOCUMENTS

CN 1719400 A 1/2006

OTHER PUBLICATIONS

Killian, Earl et al., Fast Parallel CRC Algorithm and Implementation on a Configurable Processor, IEEE, 2002.

(Continued)

*Primary Examiner* — Fritz Alphonse
(74) *Attorney, Agent, or Firm* — Ling Wu; Stephen Yang; Ling and Yang Intellectual Property (57) ABSTRACT

The present invention discloses a method for fast cyclic redundancy check (CRC) encoding, and includes: mapping a CRC encoding generator polynomial to generate an (r+1)-order transfer matrix J; deleting a first row and a first column of said (r+1)-order transfer matrix J to obtain an r-order transfer matrix; forming a r×1 column matrix by first columns of $2^{nd}$ to $r+1^{th}$ rows of said (r+1)-order transfer matrix; obtaining a zero input transfer matrix and a zero state transfer matrix of CRC encoding by the r-order transfer matrix and the r×1 column matrix; adding dummy bits before an input bit stream; and obtaining a CRC encoding check sequence according to the zero input transfer matrix, the zero state transfer matrix and the input bit stream after adding the dummy bits. The present invention further discloses an apparatus for fast cyclic redundancy check encoding.

16 Claims, 3 Drawing Sheets

(56) References Cited

OTHER PUBLICATIONS

International Search Report for PCT/CN2010/072165 dated Jun. 22, 2010.

M.C. Nielson; Method for High Speed CRC Computation; IBM Technical Disclosure Bulletin; Nov. 6, 1984.

Tong-Bi Pei and Charles Zukowski; High-Speed Parallel CRC Circuits in VLSI; IEEE Transactions on Communications; Apr. 1992.

* cited by examiner

METHOD AND DEVICE FOR FAST CYCLIC REDUNDANCY CHECK CODING

TECHNICAL FIELD

The present invention relates to the encoding and decoding technique in the communication technical field, and particularly, to a method and apparatus for fast Cyclic Redundancy Check (CRC) encoding.

BACKGROUND OF THE RELATED ART

CRC encoding is a usual error detection code, and various versions of protocols of the Wideband Code Division Multiple Access/Time Division-Synchronous Code Division Multiple Access/Long Term Evolution (WCDMA/TD-SCDMA/LTE) and so on, use various CRC encoding with different lengths so as to ensure the correctness of the information transmission under various transmission formats.

The CRC encoding is a system cyclic code, and encoded data are divided into two parts of the information sequence and check sequence, and the information sequence is at the left, and the check sequence is at the right. The CRC encoding acts as one type of cyclic code, and every time when one bit of its check sequences is cycled, the check sequence may possibly act as the check sequence of a certain specific message sequence.

The current CRC encoding methods are generally based on the following principle:

we assume that the generator polynomial of the cyclic code is $g(x)$, the polynomial of the information to be encoded is $u(x)$ and the degrees of the $g(x)$ and $u(x)$ are $r$ and $k-1$ respectively, and since the information sequence is at the left and the check sequence is at the right, and coefficients of degrees from the $n-1^{th}$ to the $n-k^{th}$ of the code polynomial $C(x)$ are information bits, and others are check bits, wherein $n-k$ is equal to $r$. Since the code polynomial $C(x)$ is certainly a multiple of the generator polynomial, thus:

$$C(x) = u(x)x^{n-k} + r(x)0|_{modg(x)}^{\equiv} \quad (1.1)$$

wherein $a \equiv b|_{mod(m)}$ denotes that a and b are congruence about the m. In the formula (1.1), $$g(x) = x^r + g_{r-1}x^{r-1} + \ldots + g_1 x 1 \quad (1.2)$$

is the generator polynomial;

$$u(x) = u_{k-1}x^{k-1} + u_{k-2}x^{k-2} + \ldots + u_1 x u_0 \quad (1.3)$$

is the information polynomial, $u_{k-1}, u_{k-2}, \ldots u_1, u_0$ are information bits, and $$r(x) = r_{n-k-1}x^{n-k-1} + r_{n-k-2}x^{n-k-2} + r_1 x r_0 \quad (1.4)$$

is the check polynomial, and the corresponding coefficients are the check bits of the input bit stream after the CRC encoding, and it can be obtained by the formula (1.1)

$$r(x) = C(x) + u(x)x^{n-k} \equiv u(x)x^{n-k}|_{modg(x)} \quad (1.5)$$

it can be seen from the formula (1.5) that calculating the CRC check bits can be implemented through the way of modulo $g(x)$ division, and the current CRC encoders are all basically implemented based on this way.

Figure 1:
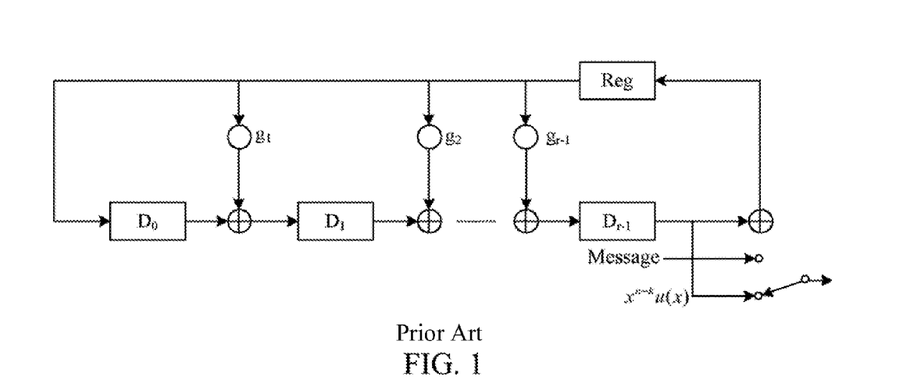
FIG. 1 is a schematic diagram of the structure of the CRC encoder which implements encoding by using the r-stage shift register in the related art.

The division circuit generally uses a feedback shift register to be implemented, and FIG. 1 is a schematic diagram of the structure of the CRC encoder which implements encoding by using the r-stage shift register in the related art, wherein $D_{r-1}$ is the shift register, $g_{r-1}$ is the coefficient of the generator polynomial $g(x)$, and the Reg is the register in FIG. 1. The CRC encoder using this structure is only able to process 1 input bit in each clock, and for the large scale system, the overhead of this circuit system is large, and the system operation efficiency is low.

SUMMARY OF THE INVENTION

In view of this, the main purpose of the present invention is to provide a method and apparatus for fast CRC encoding, which are able to carry out the CRC encoding on a plurality of input bits in one clock, save the system overhead, and improve the system operation efficiency.

In order to achieve the above purpose, the technical scheme of the present invention is implemented in this way:

the present invention provides a method for fast cyclic redundancy check encoding, and comprises:

mapping a Cyclic Redundancy Check (CRC) encoding generator polynomial to generate an (r+1)-order transfer matrix J, wherein r is a highest degree of the generator polynomial and r is a natural number;

deleting a first row and a first column of said (r+1)-order transfer matrix J to obtain an r-order transfer matrix T; forming an r×1 column matrix S by first columns of $2^{nd}$ to $r+1^{th}$ rows of said (r+1)-order transfer matrix J;

obtaining a zero input transfer matrix P and a zero state transfer matrix Ω of CRC encoding according to the obtained r-order transfer matrix T and r×1 column matrix S;

adding dummy bits before an input bit stream, wherein the number of bits of the input bit stream after adding the dummy bits is an integral multiple of a parallel operation bit width N, and N is a positive integer more than 1;

obtaining a CRC encoding check sequence of the input bit stream according to the obtained zero input transfer matrix P, the zero state transfer matrix Ω and the input bit stream after adding the dummy bits.

In the above technical scheme, said mapping the CRC encoding generator polynomial to generate the (r+1)-order transfer matrix J comprises:

when a coefficient $g_k$ of the generator polynomial is equal to 1, configuring first and second columns of a $r+1-k^{th}$ row of the transfer matrix J to 1, wherein k=0, 1, 2, 3, . . . r;

configuring $i^{th}$ row $i+1^{th}$ column of the transfer matrix J to 1, wherein i=2, 3, . . . r;

configuring other elements in the transfer matrix J to 0.

In the above technical scheme, the zero input transfer matrix P is equal to N powers of the r-order transfer matrix T; said zero state transfer matrix Ω is equal to [$T^{N-1}S\ T^{N-2}S\ \ldots\ TS\ S$].

Said dummy bits are N-mod(M, N) bits, wherein M is the number of bits of the input bit stream before adding the dummy bits.

Said CRC encoding check sequence is obtained through a following formula: $C_K = mod(PC_{K-1}\ I_K, 2)$, wherein K is a clock, and K=1, 2, . . . L/N, L is the number of bits of the input bit stream after adding the dummy bits; initial time $C_0$ is a r×1 zero matrix; and $I_K$ is an N-bit input sequence at a time of K, and $C_K$ denotes a value of a register at the time of K.

The present invention further provides an apparatus for fast cyclic redundancy check encoding, comprising: a transfer matrix mapping generation module, a transfer matrix decomposition module, a zero input/zero state transfer matrix generation module, an input bit stream adjustment module, and an encoding check sequence calculation module; wherein said transfer matrix mapping generation module is used for mapping a CRC encoding generator polynomial to generate an (r+1)-order transfer matrix, and then sending said (r+1)-order transfer matrix to the transfer matrix decomposition module, wherein r is a highest degree of the generator polynomial and r is a natural number;

said transfer matrix decomposition module is used for decomposing to obtain the (r+1)-order transfer matrix, deleting a first row and a first column of said (r+1)-order transfer matrix to obtain an r-order transfer matrix, forming a r×1 column matrix S by first columns of $2^{nd}$ to r+$1^{th}$ rows of said (r+1)-order transfer matrix, and then sending the obtained r-order transfer matrix and r×1 column matrix to the zero input/zero state transfer matrix generation module;

said zero input/zero state transfer matrix generation module is used for obtaining a zero input transfer matrix and a zero state transfer matrix of CRC encoding according to the obtained r-order transfer matrix and r×1 column matrix, and then sending the zero input transfer matrix and the zero state transfer matrix to the encoding check sequence calculation module;

said input bit stream adjustment module is used for adding dummy bits before an input bit stream, the number of bits of the input bit stream after adding the adding dummy bits being an integral multiple of a parallel operation bit width, and then segmenting the input bit stream after adding the dummy bits starting from the left according to the parallel operation bit width, and sending to the encoding check sequence calculation module in sequence;

said encoding check sequence calculation module is used for carrying out a cycle operation to obtain a CRC encoding check sequence of the input bit stream according to the received zero input transfer matrix, the zero state transfer matrix and the segmented input bit stream.

The method and apparatus for the fast CRC encoding of the present invention have the following main advantages:

(1) the parallel calculation mode is adopted, and the calculation demanded clock is proximately the 1/N of the existing serial calculation demanded clock, and the calculation efficiency is improved, wherein N is the parallel operation bit width;

(2) the matrix parameters are generated by the way of the analogy, and the expansibility of the bit width of the calculation is strong;

(3) the calculation of the encoding matrix is all implemented outside the base band chip, and the calculation way is simple and convenient;

(4) the hardware is only required to make the addition and the exclusive or operations, and is easy to be implemented.

Integrating the above advantages, compared with the prior art, the present invention sufficiently makes use of the features of the CRC encoding and adopts the parallel structure, and the calculation speed is high, and the robust and high speed parallel CRC encoding is implemented, which is convenient for the hardware integration and implementation, saves the circuit system overhead, and improves the encoding efficiency of the system.

PREFERRED EMBODIMENTS OF THE PRESENT INVENTION

The basic concept of the present invention is: making use of the conception of the transfer matrix, mapping the CRC encoding generator polynomial to generate the transfer matrix, further obtaining the zero input transfer matrix and the zero state transfer matrix, adding the dummy bits before the input bit stream at the same time so that the number of the bits of the input bit stream after adding the dummy bits is an integral multiple of the parallel operation bit width, segmenting the input bit stream after adding the dummy bits according to the parallel operation bit width starting from the left, carrying out a cycle operation on each segment of the input bit stream starting from the left according to the above zero input transfer matrix and zero state transfer matrix, and obtaining the CRC encoding check sequence of the input bit stream.

The present invention can be used in the CRC encoding unit of the base band chips in the WCDMA/TD-SCDMA/LTE and so on, which saves the CRC encoding demanded clocks, and improves the whole efficiency of the chip.

Figure 3:
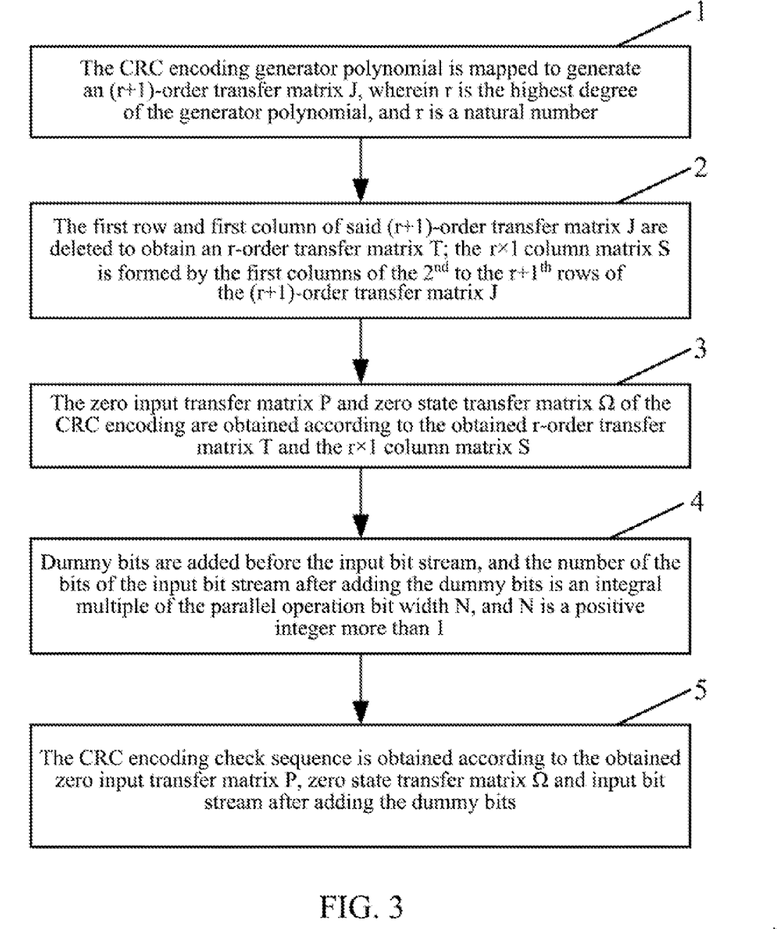
FIG. 3 is a schematic diagram of the implementing procedure of the method for fast CRC encoding according to the present invention.

The present invention provides a method for fast CRC encoding, and FIG. 3 is a schematic diagram of the implementing procedure of the method for fast CRC encoding according to the present invention, and as shown in FIG. 3, this method for fast CRC encoding comprises following steps:

step 1, the CRC encoding generator polynomial is mapped to generate the (r+1)-order transfer matrix J, wherein r is the highest degree of the generator polynomial, and r is a natural number;

step 2, the first row and first column of said (r+1)-order transfer matrix J are deleted to obtain the r-order transfer matrix T; the r×1 column matrix S is formed by the first columns of the $2^{nd}$ to the r+$1^{th}$ rows of the (r+1)-order transfer matrix J;

step 3, the zero input transfer matrix P and zero state transfer matrix Ω of the CRC encoding are obtained according to the obtained r-order transfer matrix T and the r×1 column matrix S;

step 4, dummy bits are added before the input bit stream, and the number of the bits of the input bit stream after adding the dummy bits is an integral multiple of the parallel operation bit width N, and N is the positive integer more than 1;

step 5, the CRC encoding check sequence is obtained according to the obtained zero input transfer matrix P, zero state transfer matrix Ω and input bit stream after adding the dummy bits.

Wherein in step 1, said CRC encoding generator polynomial $$g(x) = x^r + g_{r-1}x^{r-1} + \ldots + g_1 x1$$

is mapped to generate the (r+1)-order transfer matrix J, wherein r is the highest degree of the generator polynomial g(x).

The generator polynomial g(x) is mapped to generate the transfer matrix J through the following steps:

step a, the $1^{st}$ and $2^{nd}$ columns of the $1^{st}$ and $r+1^{th}$ rows of the transfer matrix J are configured to 1;

step b, the $i^{th}$ row $i+1^{th}$ column of the transfer matrix J is configured to 1, wherein i=2, 3, . . . r;

step c, if the $g_k$ in the generator polynomial g(x) is equal to 1, then the $1^{st}$ and $2^{nd}$ columns of the $r+1-k^{th}$ row of the transfer matrix J are configured to 1, wherein k=1, 2, 3, . . . r−1;

the other elements in the transfer matrix J are configured to 0.

Figure 2:
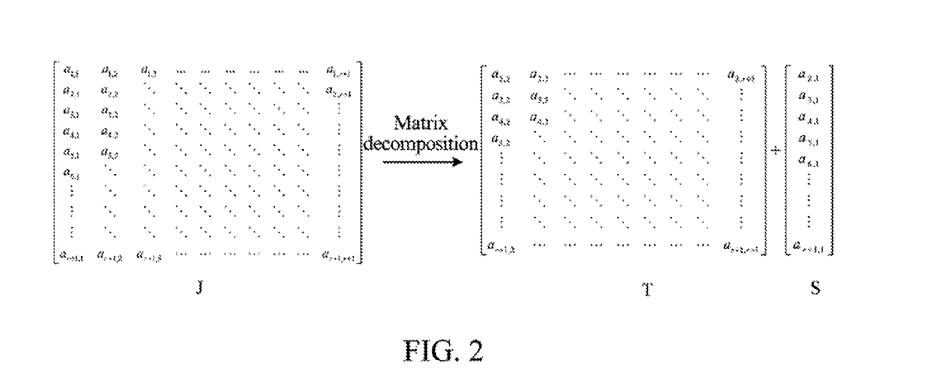
FIG. 2 is a schematic diagram of the process of decomposing the (r+1)-order transfer matrix J into the r-order transfer matrix T and the r×1 column matrix S.

FIG. 2 is a schematic diagram of the process of decomposing the (r+1)-order transfer matrix J into the r-order transfer matrix T and the r×1 column matrix S in step 2, wherein the transfer matrix J is composed of the elements $a_{i,j}$, and i and j are both natural numbers.

In step 3, said zero input transfer matrix P is the N powers of the above r-order transfer matrix T. The formula (2.3) is the cycle operation formula of the CRC encoding check sequence of the input bit stream, and the information of multiplying with the matrix P is only related to the current register state and unrelated to the current input information, which can be obtained from the formula (2.3), and thus the matrix P is called as the zero input transfer matrix of the CRC encoding. For conveniently implementing the hardware, the matrix P modulo 2 should also be carried out, and this operation expression is as follows:

$$P = \mod(T^N, 2) \quad (2.1)$$

wherein mod(a, b) denotes a modulo b, and N is the parallel operation bit width of the CRC encoding, and N is the positive integer more than 1.

Furthermore, said zero state transfer matrix Ω is $[T^{N-1}S\ T^{N-2}S \ldots TS\ S]$ in step 3. In the subsequent description, it can be obtained that the information of multiplying with the matrix Ω is only related to the current input information, and is unrelated to the current register state, thus the matrix Ω is called as the zero state transfer matrix of the CRC encoding. For conveniently implementing the hardware, the matrix Ω modulo 2 should also be carried out, and this operation expression is as follows:

$$\Omega = \mod([T^{N-1}S\ T^{N-2}S \ldots TSS], 2) \quad (2.2)$$

wherein N is the parallel operation bit width of the CRC encoding.

Figure 4:
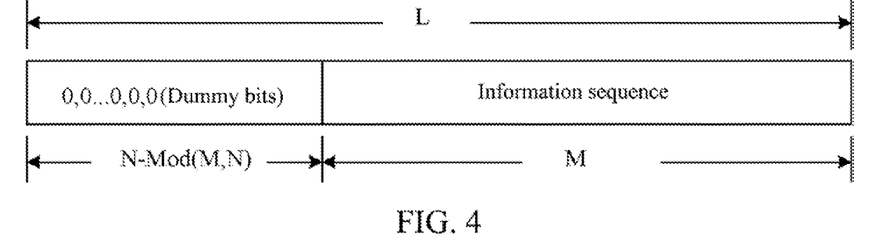
FIG. 4 is a schematic diagram of the method for adding dummy bits before the input bit stream.

Furthermore, said input bit stream is a coefficient sequence of the information polynomial in step 4, and adding dummy bits refers that the N-mod(M, N) bits of 0 should be added at the head of the input bit stream to obtain the bit stream whose number of bits is L when the number of bits M of the input bit stream is not an integral multiple of the parallel operation bit width N, and with reference to FIG. 4, it is a schematic diagram of the method for adding dummy bits before the input bit stream.

Furthermore, in step 5, obtaining the CRC encoding check sequence is specifically: dividing the input bit stream whose number of bits is L into L/N segments starting from the left, and the number of bits in each segment is N, and then the CRC encoding check sequence of the input bit stream is obtained by the cycle operation of formula (2.3):

$$C_K = \mod\left(T^N C_{K-1} + \sum_{j=N1-}^{0} T^j Si_{N-1-j}, 2\right) \quad (2.3)$$

$$= \mod\left(T^N C_{K-1} + [T^{N-1}S\ T^{N-2}S\ \ldots\ TS\ S]\begin{bmatrix}i_0\\i_1\\i_2\\\vdots\\i_{N-2}\\i_{N-1}\end{bmatrix}, 2\right)$$

$$= \mod(PC_{K-1}\ I_K, 2) + \Omega$$

wherein K is the clock, K=1, 2, . . . L/N; the initial time $C_0$ is the r×1 zero matrix; P is the zero input transfer matrix, Ω is the zero state transfer matrix, $I_K$ is the N-bit input sequence at the time of K, $C_{K-1}$ denotes the value of the register at the time of K−1, $C_K$ denotes the value of the register at the time of K, and so on, $C_{L/N}$ is the value of the register at the time of K=L/N, which namely is the CRC encoding check sequence.

For the convenient description, each clock of the hardware is considered as one cycle, and the process of operation is as follows.

```
for m = 1:1:L / N
    Y = mod(mod(P * C, 2) + mod(Ω * M ((m − 1) * N + 1 : M * N), 2),
    2);
    C = Y;
end
```

The above multiplier can be implemented by the adder in the hardware implementation, and the value in the register C after operation ends is the CRC check sequence of the input sequence.

In order to make the technical scheme and its technical advantages of the present invention clearer, below it will further describe the method for fast CRC encoding used for the base band chip in the present invention in combination with examples.

In this example, it will take the CRC encoding whose encoding length is 8 used in base band chips in WCDMA/TD-SCDMA/LTE as an example, and the parallel operation bit width N=4, CRC encoding generator polynomial $g_{CRC8}(x) = x^8 + x^7 + x^4 + x^3 + x + 1$, and information polynomial $u(x) = x^{13} + x^{12} + x^9 + x^8 + x^5 + x^4 + x^2 + x^1$.

The method for the fast CRC encoding used in the base band chip of the present invention comprises:

step 11, the CRC encoding generator polynomial $g_{CRC8}(x) = x^8 + x^7 + x^4 + x^3 + x + 1$ is mapped to generate the 9-order transfer matrix J:

$$J = \begin{bmatrix}1&1&0&0&0&0&0&0&0\\1&1&1&0&0&0&0&0&0\\0&0&0&1&0&0&0&0&0\\0&0&0&0&1&0&0&0&0\\1&1&0&0&0&1&0&0&0\\1&1&0&0&0&0&1&0&0\\0&0&0&0&0&0&0&1&0\\1&1&0&0&0&0&0&0&1\\1&1&0&0&0&0&0&0&0\end{bmatrix}$$

wherein the 9-order transfer matrix J is obtained through following steps:

step a1, the $1^{st}$ and $2^{nd}$ columns of the $1^{st}$ and $9^{th}$ rows of the 9-order transfer matrix are configured to 1;

step b1, i+1$^{th}$ column corresponding to the i$^{th}$ row of the 9-order transfer matrix is configured to 1 respectively, wherein i=2, 3, 4 . . . 8;

step c1, wherein the $g_7$, $g_4$, $g_3$, and $g_1$ are all 1, thus the 1$^{st}$ and 2$^{nd}$ columns of the 2/5/6/8$^{th}$ row of the 9-order transfer matrix are configured to 1;

the other elements in the transfer matrix J are configured to 0;

the 9-order transfer matrix is obtained through the above steps.

step 12, the above 9-order transfer matrix J is decomposed into one 8-order transfer matrix T and one 8×1 column matrix S;

$$T = \begin{bmatrix} 1 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 0 & 0 & 0 & 0 & 0 & 0 & 1 & 0 \\ 1 & 0 & 0 & 0 & 0 & 0 & 0 & 1 \\ 1 & 0 & 0 & 0 & 0 & 0 & 0 & 0 \end{bmatrix} S = \begin{bmatrix} 1 \\ 0 \\ 0 \\ 1 \\ 1 \\ 0 \\ 1 \\ 1 \end{bmatrix}$$

wherein the 8-order transfer matrix is obtained by deleting the first row and first column of the 9-order transfer matrix J, and the 8×1 column matrix is composed of the elements of the first columns of the 2$^{nd}$ to 9$^{th}$ rows of the 9-order transfer matrix J.

Step 13, the zero input transfer matrix P of the CRC encoding is obtained according to the transfer matrix T and formula P=mod(T$^4$, 2) obtained in step 12:

$$P = \begin{bmatrix} 0 & 1 & 1 & 1 & 1 & 0 & 0 & 0 \\ 0 & 1 & 0 & 0 & 0 & 1 & 0 & 0 \\ 0 & 0 & 1 & 0 & 0 & 0 & 1 & 0 \\ 1 & 0 & 0 & 1 & 0 & 0 & 0 & 1 \\ 1 & 0 & 1 & 1 & 0 & 0 & 0 & 0 \\ 0 & 0 & 1 & 0 & 0 & 0 & 0 & 0 \\ 0 & 0 & 0 & 1 & 0 & 0 & 0 & 0 \\ 1 & 1 & 1 & 1 & 0 & 0 & 0 & 0 \end{bmatrix}$$

step 14, the zero state transfer matrix Ω of the CRC encoding is obtained according to the transfer matrix T and formula $$\Omega = \text{mod}([T^3]S, T^2 S\ TS\ S\ 2)$$

obtained in step 12:

$$\Omega = \begin{bmatrix} 0 & 1 & 1 & 1 \\ 0 & 1 & 0 & 0 \\ 0 & 0 & 1 & 0 \\ 1 & 0 & 0 & 1 \\ 1 & 0 & 1 & 1 \\ 0 & 0 & 1 & 0 \\ 0 & 0 & 0 & 1 \\ 1 & 1 & 1 & 1 \end{bmatrix}$$

step 15, two dummy bits are added before the input bit stream;

in this step, M=14 in the input bit stream, the parallel operation bit width N=4, and in order to make the number of bits of the input bit stream to be an integral multiple of the parallel operation bit width, the 4-mod(14, 4)=2 bits of 0 are added before the input bit stream, and the number of bits of the input bit stream after adding the dummy bits L is equal to 16.

Step 16, the input bit stream after adding the dummy bits is divided into L/N=4 segments, and every 4 input bits are substituted into the formula starting from the left, and the CRC encoding check sequence is obtained by the cycle operation:

In this example, the input sequence is 11001100110110, and the CRC encoding check sequence obtained by using the method of the present invention is: 10010110.

Obtaining the above CRC encoding check sequence by the existing method needs 14 clocks, but obtaining the above CRC encoding check sequence by the method of the present invention only needs 4 clocks, which solves the problems of the existing CRC encoding such as many occupied clocks and low calculation efficiency, and the CRC encoding method of the present invention uses the parallel structure, and a plurality of bits are involved in the operation at the same time, which greatly improves the efficiency of the CRC encoding, saves the system overhead, and improves the system operation efficiency.

Figure 5:
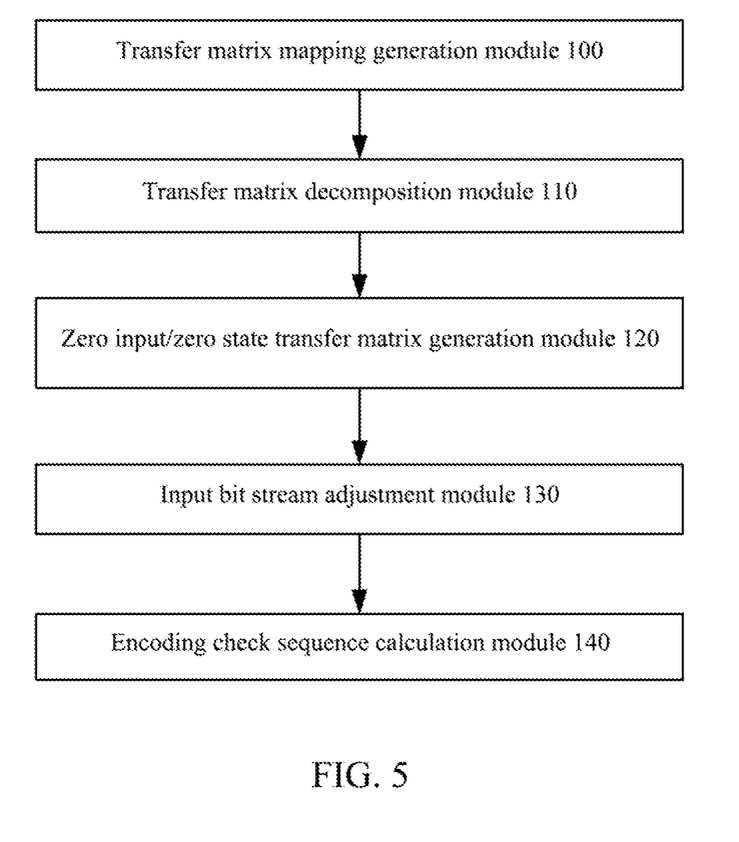
FIG. 5 is a schematic diagram of the composition structure of the apparatus for fast CRC encoding according to the present invention.

The present invention further provides an apparatus for implementing the method for fast CRC encoding of the present invention, and FIG. 5 is a schematic diagram of the composition structure of the apparatus for fast CRC encoding according to the present invention, and as shown in FIG. 5, the apparatus for fast CRC encoding of the present invention comprises: a transfer matrix mapping generation module 100, a transfer matrix decomposition module 110, a zero input/zero state transfer matrix generation module 120, an input bit stream adjustment module 130, and an encoding check sequence calculation module 140; specifically, the transfer matrix mapping generation module 100 is used for mapping the CRC encoding generator polynomial to generate the (r+1)-order transfer matrix, and then sending this (r+1)-order transfer matrix to the transfer matrix decomposition module 110, wherein r is the highest degree of the generator polynomial and r is a natural number;

the transfer matrix decomposition module 110 is used for decomposing to obtain the (r+1)-order transfer matrix, deleting the first row and the first column of this (r+1)-order transfer matrix to obtain the r-order transfer matrix, obtaining the r×1 column matrix by the first columns of the 2$^{nd}$ to r+1$^{th}$ rows of this (r+1)-order transfer matrix, and then sending the obtained r-order transfer matrix and r×1 column matrix to the zero input/zero state transfer matrix generation module 120;

the zero input/zero state transfer matrix generation module 120 is used for obtaining the zero input transfer matrix and zero state transfer matrix of the CRC encoding according to the obtained r-order transfer matrix and r×1 column matrix, and then sending the zero input transfer matrix and zero state transfer matrix to the encoding check sequence calculation module 140;

the input bit stream adjustment module 130 is used for adding dummy bits before the input bit stream so that the number of bits of the input bit stream after adding the dummy bits is an integral multiple of the parallel operation bit width, then segmenting the input bit stream after adding the dummy bits starting from the left according to the parallel operation bit width, and sending to the encoding check sequence calculation module 140 in sequence;

the encoding check sequence calculation module 140 is used for carrying out the cycle operation to obtain the CRC encoding check sequence of the input bit stream according to the received zero input transfer matrix, zero state transfer matrix and the segmented input bit stream.

The method and apparatus for fast CRC encoding of the present invention play a quite major role in improving efficiency of the CRC encoding in the base band chips of WCDMA/TD-SCDMA/LTE and so on and saving the resources of the base band chips. The concept of the transfer matrix is used to carry out the transformation on the generator polynomial to obtain the transfer matrix between the input and output, and the transfer matrix is used to carry out operation on the input sequence after the serial-to-parallel conversion to obtain a plurality of the new states of the register after processing a plurality of bits, which is repeated until finishing processing all the input bits to obtain the CRC encoding check sequence of this input bit stream.

The apparatus for fast CRC encoding of the present invention can be implemented through the hardware circuit or in the way of combining the software and hardware.

When it is implemented by the hardware, the chip cannot be modified any more after completing the design. Since systems of WCDMA/TD-SCDMA/LTE and so on, all support the CRC encoding with a plurality of lengths, it is only required to fix the zero input/zero state matrix parameters corresponding to each CRC generator polynomial obtained by the method of the present invention in the system, and the hardware selects one hardware logic module thereinto according to the register configuration to carry out the operation to implement the CRC encoding with a variable length.

When it is implemented by combining the software and hardware, a way of the software calculation is used within the chip to calculate the CRC encoding, then the corresponding CRC generator polynomial can be modified in real-time by updating the matrix parameters stored in the memory so as to meet the requirements of upgrading the version, module being universal and so on.

Certainly, the present invention can also have other various examples, and various corresponding modifications and transformations can be made according to the present invention by those having skills in the art without departing from the spirit and essence of the present invention, and these corresponding modifications and transformations shall all fall into the protection scope of the present invention.

What is claimed is:

1. A method for fast cyclic redundancy check encoding, comprising the following steps that are executed by a base band chip:
mapping a Cyclic Redundancy Check (CRC) encoding generator polynomial to generate an (r+1)-order transfer matrix J, wherein r is a highest degree of the generator polynomial and r is a natural number;
deleting a first row and a first column of said (r+1)-order transfer matrix J to obtain an r-order transfer matrix T; forming an r×1 column matrix S by first columns of $2^{nd}$ to r+$1^{th}$ rows of said (r+1)-order transfer matrix J;
obtaining a zero input transfer matrix P and a zero state transfer matrix $\Omega$ of CRC encoding according to the obtained r-order transfer matrix T and r×1 column matrix S;
adding dummy bits before an input bit stream, wherein the number of bits of the input bit stream after adding the dummy bits is an integral multiple of a parallel operation bit width N, and N is a positive integer more than 1;
obtaining a CRC encoding check sequence of the input bit stream according to the obtained zero input transfer matrix P, the zero state transfer matrix $\Omega$ and the input bit stream after adding the dummy bits.

2. The method for fast cyclic redundancy check encoding as claimed in claim 1, wherein said mapping the CRC encoding generator polynomial to generate the (r+1)-order transfer matrix J comprises:
when a coefficient $g_k$ of the generator polynomial is equal to 1, configuring first and second columns of a r+1−$k^{th}$ row of the transfer matrix J to 1, wherein k=0, 1, 2, 3, . . . r;
configuring $i^{th}$ row i+$1^{th}$ column of the transfer matrix J to 1, wherein i=2, 3, . . . r;
configuring other elements in the transfer matrix J to 0.

3. The method for fast cyclic redundancy check encoding as claimed in claim 1, wherein the zero input transfer matrix P is equal to N powers of the r-order transfer matrix T; said zero state transfer matrix $\Omega$ is equal to [$T^{N-1}$S $T^{N-2}$S . . . TS S].

4. The method for fast cyclic redundancy check encoding as claimed in claim 3, wherein said dummy bits are N-mod (M, N) bits, wherein M is the number of bits of the input bit stream before adding the dummy bits.

5. The method for fast cyclic redundancy check encoding as claimed in claim 4, wherein said CRC encoding check sequence is obtained through a following formula: $C_K$=mod (P$C_{K-1}$ $I_K$, 2), wherein K is a clock, and K=1, 2, . . . L/N, L is the number of bits of the input bit stream after adding the dummy bits; initial time $C_0$ is an r×1 zero matrix; $I_K$ is an N-bit input sequence at a time of K, and $C_K$ denotes a value of a register at the time of K.

6. An apparatus for fast cyclic redundancy check encoding, comprising: a transfer matrix mapping generation module, a transfer matrix decomposition module, a zero input/zero state transfer matrix generation module, an input bit stream adjustment module, and an encoding check sequence calculation module; wherein
said transfer matrix mapping generation module is used for mapping a Cyclic Redundancy Check (CRC) encoding generator polynomial to generate an (r+1)-order transfer matrix J, and then sending said (r+1)-order transfer matrix J to the transfer matrix decomposition module, wherein r is a highest degree of the generator polynomial and r is a natural number;
said transfer matrix decomposition module is used for decomposing the obtained (r+1)-order transfer matrix J, deleting a first row and a first column of said (r+1)-order transfer matrix J to obtain an r-order transfer matrix T, forming an r×1 column matrix S by first columns of $2^{nd}$ to r+$1^{th}$ rows of said (r+1)-order transfer matrix J, and then sending the obtained r-order transfer matrix T and r×1 column matrix S to the zero input/zero state transfer matrix generation module;
said zero input/zero state transfer matrix generation module is used for obtaining a zero input transfer matrix P and a zero state transfer matrix $\Omega$ of CRC encoding according to the obtained r-order transfer matrix T and r×1 column matrix S, and then sending the zero input transfer matrix P and the zero state transfer matrix $\Omega$ to the encoding check sequence calculation module;
said input bit stream adjustment module is used for adding dummy bits before an input bit stream, the number of bits of the input bit stream after adding the dummy bits being an integral multiple of a parallel operation bit width N, wherein N is a positive integer more than 1, and then segmenting the input bit stream after adding the dummy bits starting from left according to the parallel operation bit width N, and sending to the encoding check sequence calculation module in sequence;

said encoding check sequence calculation module is used for carrying out a cycle operation to obtain a CRC encoding check sequence of the input bit stream according to the received zero input transfer matrix P, the zero state transfer matrix $\Omega$ and the segmented input bit stream.

7. The method for fast cyclic redundancy check encoding as claimed in claim 2, wherein the zero input transfer matrix P is equal to N powers of the r-order transfer matrix T; said zero state transfer matrix $\Omega$ is equal to $[T^{N-1}S\ T^{N-2}S\ \ldots TS\ S]$.

8. The method for fast cyclic redundancy check encoding as claimed in claim 7, wherein said dummy bits are N-mod(M, N) bits, wherein M is the number of bits of the input bit stream before adding the dummy bits.

9. The method for fast cyclic redundancy check encoding as claimed in claim 8, wherein said CRC encoding check sequence is obtained through a following formula: $C_K$=mod($PC_{K-1}\ I_K$,2), wherein K is a clock, and K=1, 2, . . . L/N, L is the number of bits of the input bit stream after adding the dummy bits; initial time $C_0$ is an r×1 zero matrix; $I_K$ is an N-bit input sequence at a time of K, and $C_K$ denotes a value of a register at the time of K.

10. The apparatus for fast cyclic redundancy check encoding as claimed in claim 6, wherein said mapping the CRC encoding generator polynomial to generate the (r+1)-order transfer matrix J comprises:
when a coefficient $g_k$ of the generator polynomial is equal to 1, configuring first and second columns of a r+1−$k^{th}$ row of the transfer matrix J to 1, wherein k=0, 1, 2, 3, . . . r;
configuring $i^{th}$ row i+$1^{th}$ column of the transfer matrix J to 1, wherein i=2, 3, . . . r;
configuring other elements in the transfer matrix J to 0.

11. The apparatus for fast cyclic redundancy check encoding as claimed in claim 6, wherein the zero input transfer matrix P is equal to N powers of the r-order transfer matrix T; said zero state transfer matrix $\Omega$ is equal to $[T^{N-1}S\ T^{N-2}S\ \ldots TS\ S]$.

12. The apparatus for fast cyclic redundancy check encoding as claimed in claim 11, wherein said dummy bits are N-mod(M, N) bits, wherein M is the number of bits of the input bit stream before adding the dummy bits.

13. The apparatus for fast cyclic redundancy check encoding as claimed in claim 12, wherein said CRC encoding check sequence is obtained through a following formula: $C_K$=mod($PC_{K-1}\ I_K$, 2), wherein K is a clock, and K=1, 2, . . . L/N, L is the number of bits of the input bit stream after adding the dummy bits; initial time $C_0$ is an r×1 zero matrix; $I_K$ is an N-bit input sequence at a time of K, and $C_K$ denotes a value of a register at the time of K.

14. The apparatus for fast cyclic redundancy check encoding as claimed in claim 10, wherein the zero input transfer matrix P is equal to N powers of the r-order transfer matrix T; said zero state transfer matrix $\Omega$ is equal to $[T^{N-1}S\ T^{N-2}S\ \ldots TS\ S]$.

15. The apparatus for fast cyclic redundancy check encoding as claimed in claim 14, wherein said dummy bits are N-mod(M, N) bits, wherein M is the number of bits of the input bit stream before adding the dummy bits.

16. The apparatus for fast cyclic redundancy check encoding as claimed in claim 15, wherein said CRC encoding check sequence is obtained through a following formula: $C_K$=mod($PC_{K-1}\ I_K$, 2), wherein K is a clock, and K=1, 2, . . . L/N, L is the number of bits of the input bit stream after adding the dummy bits; initial time $C_0$ is an r×1 zero matrix; $I_K$ is an N-bit input sequence at a time of K, and $C_K$ denotes a value of a register at the time of K.

* * * * *